United States Patent
Yuan

(10) Patent No.: US 7,370,250 B2
(45) Date of Patent: May 6, 2008

(54) TEST PATTERNS TO INSURE READ SIGNAL INTEGRITY FOR HIGH SPEED DDR DRAM

(75) Inventor: Der-Min Yuan, Hsin chuang (TW)

(73) Assignee: Etron Technology, Inc., Hsin-Chu (TW)

( * ) Notice: Subject to any disclaimer, the term of this patent is extended or adjusted under 35 U.S.C. 154(b) by 152 days.

(21) Appl. No.: 11/314,258

(22) Filed: Dec. 21, 2005

(65) Prior Publication Data

US 2007/0143649 A1 Jun. 21, 2007

(51) Int. Cl.
*G11C 29/00* (2006.01)
*G06F 11/00* (2006.01)

(52) U.S. Cl. .................. 714/718; 714/738; 365/201

(58) Field of Classification Search ...................... None
See application file for complete search history.

(56) References Cited

U.S. PATENT DOCUMENTS

| | | | | |
|---|---|---|---|---|
| 4,654,814 A | * | 3/1987 | Sebald et al. .................. | 708/5 |
| 4,710,932 A | * | 12/1987 | Hiroshi ....................... | 714/736 |
| 5,600,660 A | | 2/1997 | Wolf | |
| 5,617,531 A | * | 4/1997 | Crouch et al. ................ | 714/30 |
| 5,828,608 A | * | 10/1998 | Nguyen et al. ........ | 365/189.05 |
| 5,986,944 A | * | 11/1999 | Merritt .................. | 365/189.05 |
| 6,799,290 B1 | | 9/2004 | Kirihata et al. | |
| 6,813,696 B2 | | 11/2004 | Kanada et al. | |

* cited by examiner

*Primary Examiner*—Phung M. Chung
(74) *Attorney, Agent, or Firm*—Saile Ackerman LLC; Stephen B. Ackerman

(57) ABSTRACT

A test method and implementation is described to test an internal data path within a DDR DRAM during a read operation. A worse case test sequence and a compliment of the worse case test sequence is stored within memory. The test sequence and its compliment are arranged within a data word such that upon read out of the data word, the test sequences or the compliment of the test sequences is applied to a plurality of wire connections of the internal data path. Each test sequence comprises a plurality of logical bits of the same value followed by a bit of the opposite value, which tests for charge buildup on each element of the internal data path. Adjacent elements of the internal data path connect test sequences that are compliments to maximize voltage differentials and enhance possibility of signal coupling between wire elements of the internal data path.

17 Claims, 2 Drawing Sheets

TEST PATTERNS TO INSURE READ SIGNAL INTEGRITY FOR HIGH SPEED DDR DRAM

BACKGROUND OF THE INVENTION

1. Field of Invention

The present invention is related to memory testing and in particular test patterns to insure read signal integrity for a DDR DRAM.

2. Description of Related Art

A DDR DRAM is a memory chip that has been designed to provide high-speed reading and writing of data. In order to accomplish the high-speed, data is read or written using both edges of a clock. Thus for each clock cycle there is two bits of data being transferred to, or from, memory for each of two data words, where each data word comprises two four-bit segments. The signal lines for connecting the data from and to the sense amplifiers of the memory form a data bus and are routed on the memory chip in close proximity where wire elements of the data bus provide an opportunity for coupling between the high speed data signals. The ability of the bus circuitry to operate properly in a signal coupling environment is important for the memory chip to perform at high speed. Also, if a sequence of data bits of the same logical value is coupled onto a wire element of the data bus, an additional charge is built up on the wire and devices of the data path circuit that needs to be discharged when a data bit of opposite value is propagated on the wire element. A test to measure the ability of the driver of the wire element to overcome the additional charge is important to insure the operational integrity of the memory chip.

In U.S. Pat. No. 6,799,290 (Kirihata et al.) a method is directed to the testing of a data path of a memory device including a plurality of stages of the data path and the transfer of data along the data path. U.S. Pat. No. 6,813,696 (Kanada et al.) is directed to a method to read and write a memory array chip in synchronization with an externally supplied clock and to test the operation of the memory chip with conventional memory test equipment. U.S. Pat. No. 5,600,660 (Wolf) is directed to a method for determining the number of defective digital data bits transmitted over a data transmission path being tested.

SUMMARY OF THE INVENTION

It is an objective of the present invention to test a high speed DDR DRAM to ensure signal integrity during a read operation.

It is further an objective of the present invention to test coupling between wire elements of an internal memory chip data bus.

It is still further an objective of the present invention to test the capability of a bus signal driver to handle extra charge buildup on a bus resulting from a sequence of data bits of the same logical value.

It is also an objective of the present invention to provide a worse case test pattern to be applied to the wire elements of the internal memory chip data path.

In the present invention the read integrity of an internal data path comprising both interconnecting wires and semiconductor devices within a DDR DRAM is tested. The data path comprises of four wiring elements that are routed on the DDR DRAM in a parallel fashion between driver and output circuitry. The speed at which the memory chip operates necessitates that the elements of the data path be tested to detect problems with signal coupling between data path elements and charge buildup on the wire elements and semiconductor devices, which make up the data path.

A worse case test pattern is coupled to a first wire element, a complement of the worse case test pattern is coupled to a second wire element adjacent to the first wire element, the worse case test pattern is coupled to a third wire element of the bus that is adjacent to the second wire element, and the complement of the worse case test pattern is coupled to a fourth wire element of the bus that is adjacent to the third wire element. The worse case test patterns and the complements of the worse case test patterns are propagated from a driver circuit to an output circuit over the bus simultaneously using the access of a data word stored within the memory.

The stored data word is constructed such that when the data word is read from the memory, a worse case pattern of data bits is coupled to the first wire element of the bus, a logical complement of the worse case pattern of data bits is coupled to the second wire element, the worse case pattern of data bits is coupled to the third wire element of the bus and the logical complement of the worse case pattern of data bits is coupled to the fourth wire element of the data bus.

The worse case pattern of data bits that is used to test the data path is "0,0,0,1" and the complement of the worse case pattern of data bits is "1,1,1,0". The first three data bits in the worse case pattern and the complement are of a same value with the fourth data bit being of opposite value. This allows the driver of the wire elements of the data path to be tested for the ability to overcome the extra charge placed on the elements of a data path by the initial three data bits of the same value. The worse case pattern of data bits and the complement are respectively coupled to adjacent wire elements of the data path such that a data bit "0" occurs on a first wire element simultaneously to a data bit "1" on an adjacent second wire element of the data path. This provides a maximum opportunity for electromagnetic coupling of signals between wire elements of the bus.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
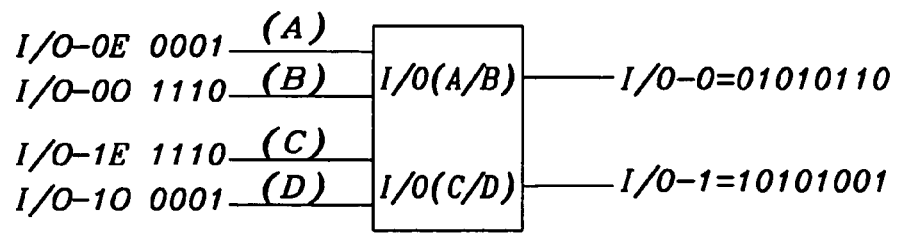
FIG. 1 is a diagram of the present invention of two I/O words formed by even and odd data bits that are coupled on separate wire elements of a data path.

In FIG. 1 is shown a diagram of a memory bus configuration comprising wire elements A, B, C and D. Data is pipelined onto the wire elements and then combined to produce an output data word that is equivalent to the data stored in memory. Data on wire element A is combined with data on wire element B to produce a data word I/O-0. Data on wire element C is combined with data on wire element D to produce data word I/O-1. A first worse case data pattern I/O-0E=0001 representing even data bits of an I/O data word is coupled onto wire element A, and a second worse case data pattern I/O-0O=1110 representing odd data bits of the I/O data word is coupled to wire element B. The first and second worse case data patterns are combined to form a data word I/O-0=01010110, which is the same as stored in memory. In similar fashion wire element C is coupled to even data bits I/O-1E=0001 and wire element D is coupled to odd data bits I/O-1O=1110. The even and odd data bits on wire elements C and D are combined to form a data word I/O-1=10101001, which is the same as stored in memory.

Each of the worse case data patterns is formed by three consecutive data bits of the same value followed by a data bit of opposite value. As the three consecutive data bits of the same value are clocked onto the wire elements of the bus, an additional charge is imparted to the bus. When the fourth data bit of opposite value is clocked onto the wire elements of the bus, the driver circuit coupling the data bits to the wire element must have adequate drive capability to overcome the additional charge and allow the output circuits at the output of the bus to properly detect the fourth data bit.

Figure 3:
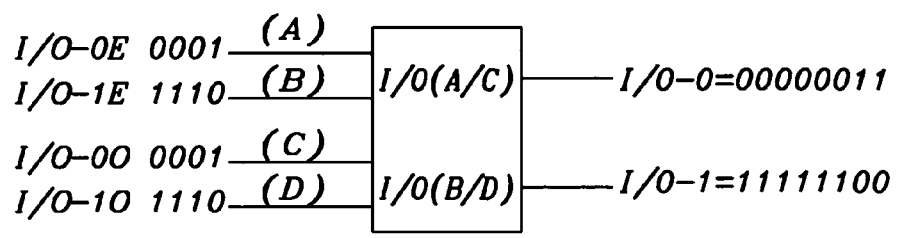
FIG. 3 is a diagram of the present invention in which even and odd data bits for adjacent data path wire elements are stored in separate data words.

As shown in FIG. 1, the even data bits I/O-0E and I/O-1E are logical complements. Data bits I/O-0O are a logical complement of I/O-0E and data bits I/O-1O are a logical complement of I/O-1E. The data bus comprising wire elements A, B, C, D is organized in FIG. 1 to connect data I/O-0E on wire element A to the output of the bus, data I/O-0O on wire element B, data I/O-1E on wire element C and data I/O on wire element D. The I/O data word I/O-0 and I/O-1 are defined in memory to produce the worse case data shown in FIG. 1. In FIG. 3 the physical layout of the bus A, B, C, and D connects I/O-0E to wire element A, I/O-0O to wire element C, I/O-1E to wire element B and I/O-1O to wire element D. In order to maintain the bit pattern "0001" on element A, bit pattern "1110" on element B, bit pattern "0001" on element C and bit pattern "1110" on element D, the data stored in memory representing the I/O words must be changed to I/O-0=00000011 and I/O-1=11111100. Although the I/O words I/O-0 and I/O-1 are dramatically different between FIG. 1 and FIG. 3, the reading of the data out of memory produces the same results of producing a sequence of worse case bits "0001" on wire element A simultaneously to the sequence of worse case bits "1110" on wire element B simultaneously to the sequence of worse case bits "0001" on wire element C simultaneous to the sequence of worse case bits "1110" on wire element D. This arrangement of alternating the worse case bit pattern of "0001" next to "1110" next to "0001" next to "1110" maximizes the coupling voltage between adjacent wire elements of the bus.

Figure 2:
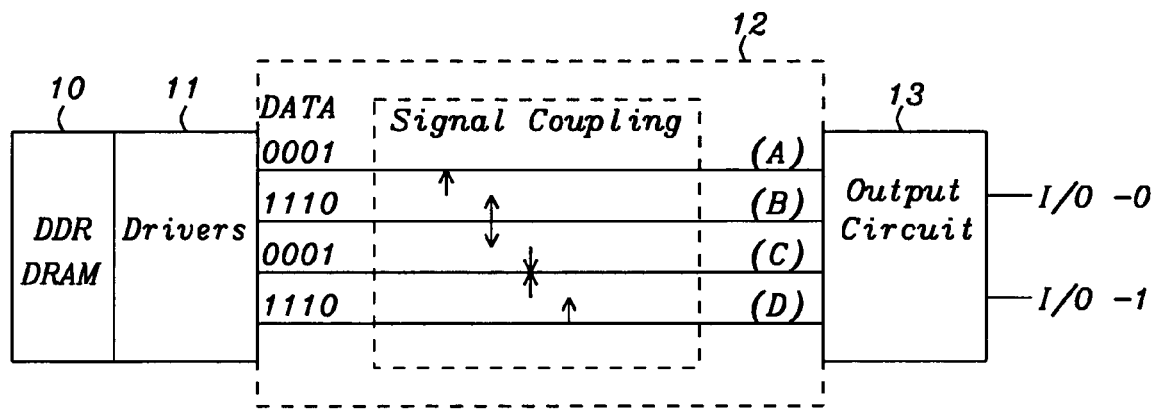
FIG. 2 is a diagram of the present invention demonstrating coupling between wire elements of a data path using a worse case test pattern.

FIG. 2 shows a DDR DRAM 10 is connected to a set of driver circuits 11, which connect data signals onto a set of wires forming a data bus 12 that connect to output circuits 13. The drivers 11, the data bus 12 and the output circuits 13 form a data path of the DDR DRAM. An adequate strength of the driver circuits 11 is required to over come both coupling between wire elements of the data bus 12 and charge build up resulting from successive data bits of a same logical value. A test word is stored in the DDR DRAM 10, and when read from memory, the test word allows the drivers to simultaneously connect a worse case combination of data to the wires forming the data bus 12.

The worse case combination of data is a sequence of data bits of particular logical value followed by a last data bit of the opposite logical value that are connected to a wire of the data bus with the logical complement of the sequence of data bits connected to adjacent wires. The sequence of data bits of the same value charges the capacitance of the particular connection in the data path, and the last bit of opposite logical value tests whether the driver has sufficient drive capability to overcome the charge build up by the previous bits of the sequence to allow the output circuit to detect the last data bit. By connecting a data sequence of bits onto one wire of the data path and simultaneously connecting a complement of the data sequence onto adjacent wire, the signal perturbation to data bit signals by coupling from adjacent wires is maximized. If the test data is outputted from the output circuit 13 is the same as the test word stored in the DDR DRAM, the driver and output circuits are tested good for their ability to operate under worse case data conditions.

In FIG. 2 a physical layout of the I/O data bus 12 is shown where data sequence "0001" is connected by a first driver circuit to wire element A of the bus, data sequence "1110" is connected by a second driver circuit to wire element B, data sequence "0001" is connected by a third driver circuit to wire element C and data sequence "1110" is connected by a fourth driver circuit to element D. The four data sequences are connected simultaneously to the wire elements A, B, C and D by the driver circuits 11 and propagate to a output circuit 13 at the output of each wire element of the data bus 12. The organization of the simultaneous occurring data provides the capability to measure coupling between adjacent wire elements. The coupling is symbolically shown by an arrow pointing from a logical "1" to a logical "0". For example, when the first data bit of each sequence is simultaneously coupled to the wire elements of the bus, wire element A has a coupling potential formed between a logical "0" of wire element A and a logical "1" of wire element B. Wire element B has a coupling potential between the logical "1" of B, the logical "0" of A and the logical "0" of C. Wire element C has a coupling potential between the logical "0" of C, the logical "1" of B and the logical "1" of D. Wire element D has a coupling potential between the logical "1" of D and the logical "0" of C. These coupling signals are a mechanism by which the data sequences connected to the wire elements can be perturbed to provide a false signal at the output circuits. The coupling test provides a measure of the strength of the driver circuits to provide a data sequence that is sufficiently strong to negate the effects of any coupling signals.

Figure 4:
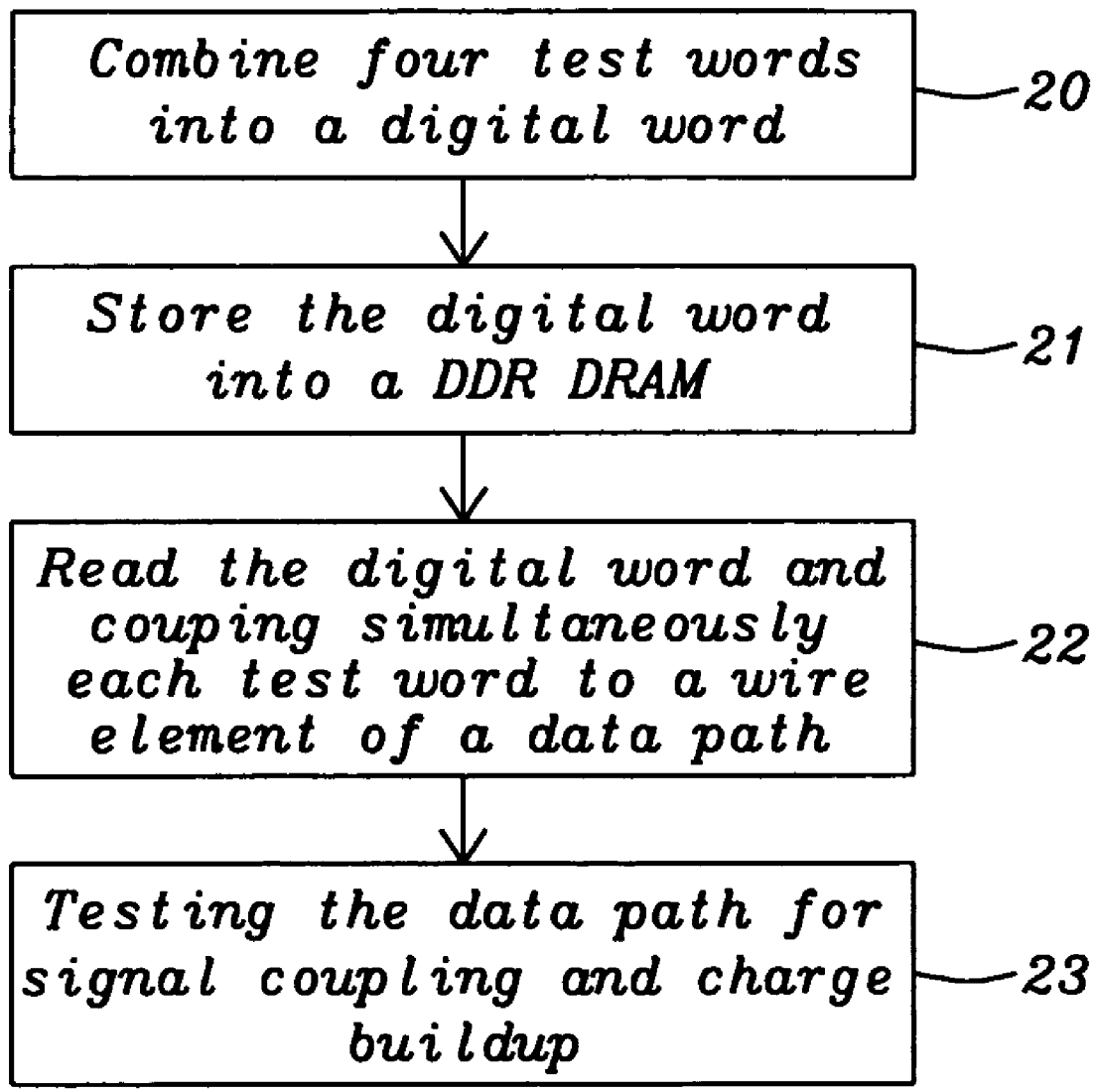
FIG. 4 is a diagram of the present invention for a method to test an internal data path for signal coupling and stored charge buildup.

In FIG. 4 is shown a method for providing test patterns to test an internal memory data path of a DDR DRAM. The data path comprises the drivers 11, the data bus 12 and the output circuits 13 shown in FIG. 2. A digital word is created that contains four test words 20. The test words each comprise four bits that are to be read and processed simultaneously through four wire elements of the internal memory bus. The digital word is configured such that a first test word is coupled to a first wire element of the bus, a second test word coupled to a second wire element, a third test word couple to a third wire element and a fourth test word coupled to a fourth wire element. The first and third test words are formed with a sequence of three logical zeros followed by a logical one. The second and the fourth test words are formed with a sequence of three logical ones followed by a logical zero.

The digital word is stored into memory of the DDR DRAM 21 and read out to produce a test of the internal memory data path comprising interconnecting wire and semiconductor devices. Each test word contained within the digital word is coupled simultaneously to a wire element of the internal memory data path 22. The first test word, comprising a sequence of three logical zeros followed by a logical one, is coupled to a first wire element of the data path. The second test word, comprising a sequence of three logical ones followed by a logical zero, is coupled to a second wire element of the data path. The third test word, comprising a sequence of three logical zeros followed by a logical one, is coupled to a third wire element of the data path, and the fourth test word, comprising a sequence of three logical ones followed by a logical zero, is coupled to a fourth wire element of the data path.

The four test words are propagated simultaneously through the four wire elements of the data path to test for charge buildup in the data path and signal coupling between wire elements 23. The sequence of three logical bit of the same value followed by a logical bit of opposite value tests the capability of the driver circuit for each wire element of the data path to discharge the charge build up that occurs during the initial three logical bits of the same value. The second and fourth test words are logical complements of the first and third test words. This allows a maximum signal differential between adjacent wire elements of the bus to stress signal integrity between wire elements and the ability of the driver and output circuitry to avoid errors caused by the coupled signals.

While the invention has been particularly shown and described with reference to preferred embodiments thereof, it will be understood by those skilled in the art that various changes in form and details may be made without departing from the spirit and scope of the invention.

What is claimed is:

1. A test pattern for testing a path internal to a memory chip, comprising:
   a) a test word and a complement test word, wherein said complement test word is a logical complement of said test word;
   b) said test word comprising a sequence of data bits of a same value followed by a last data bit of opposite value;
   c) said test word coupled to a conductive element of a data path, wherein said data path comprises a plurality of conductive elements routed in parallel, and wherein each conductive element of said plurality of conductive elements comprise a data driver circuit, a receiver circuit and a wire connecting said driver to said receiver;
   d) said complement test word coupled to an immediately adjacent conductive element of said data path;
   e) said test word and said complement test word execute simultaneously and form a test pattern to test said data path; and
   f) successful receipt of said last data bit by said receiver circuit determines goodness of the element of the data path.

2. The test pattern of claim 1, wherein said memory chip is a DDR DRAM.

3. The test pattern of claim 1, wherein said sequence of data bits produce a charge buildup on said conductive elements of the data path when said sequence of data bits are of the same value whereby said data bit of opposite value tests capability of said data driver circuits to negate said charge buildup.

4. The test pattern of claim 1, wherein said test word and said complement of the test word applied simultaneous to adjacent conductive elements, tests effects of coupling between said adjacent conductive elements.

5. The test pattern of claim 1, wherein said test word and said complement of the test word form a worse case stimulus for testing said data path within a DDR DRAM.

6. The test pattern of claim 1, wherein said sequence of test bits of the same value is the sequence of three test bits of the same value.

7. A method of testing an internal data path of a memory chip, comprising:
   a) coupling a first test word to an input of a first element of an internal data path of a memory chip, wherein the first data word comprises a sequence of data bits of a same value followed by an opposite valued data bit;
   b) coupling a logical complement of said first test word to said input of a second element of the data path, where said second element is adjacent and parallel to said first element;
   c) coupling a second test word to said input of a third element of said data path, where said third element is adjacent and parallel to said second element, wherein the second test word comprises a second sequence of data bits of the same value followed by the opposite valued data bit;
   d) coupling said logical complement of said second test word to said input of a fourth element of said data path, where said fourth element is adjacent and parallel to said third element;
   e) propagating simultaneously said first, second, third and fourth test words to an output of said data path; and
   f) measuring integrity of a logical word formed from said test words propagated on the elements of said data path, wherein a successful receipt of the last bit and the complement of the last bit determines the successful test of said data path.

8. The method of claim 7, wherein said first test word is a sequence of three data bits of a same logic value followed by a fourth data bit of an opposite logic value.

9. The method of claim 8, wherein the sequence of three data bits of the same logic value produce an added charge on the elements of the data path in which a driver for each element discharges the data path with said fourth data bit.

10. The method of claim 7, wherein said first and said second test words are identical and each forming a part of separate logical words.

11. The method of claim 7, wherein said first and said second test words are identical and combine to form a logical word.

12. The method of claim 7, wherein propagating simultaneously the first, second, third and fourth test words tests coupling between said wire elements of said data path.

13. A test system for an internal data path of a DDR DRAM, comprising:
   a) a means for storing a digital word containing a plurality of test words;
   b) a means for organizing said plurality of test words within said digital word to align with a plurality of wire elements during a read operation;
   c) a means for coupling said plurality of test words simultaneously to said plurality of wire elements such that each test word of said plurality of test words is unique to a wire element of said plurality of wire elements, and tests words on adjacent wire elements are logical complements; and
   d) a means for testing charge buildup on each data path element and signal coupling between adjacent wire elements of said data path, wherein said each data path element comprises semiconductor devices and an interconnecting wire, and whereupon successful receipt of a last data bit by a receiver on each data path element determines a good data path element.

14. The test of claim 13, wherein the means for organizing said plurality of test words is accomplished by interleaving said test words in a fashion in which each said test word is connected to a unique data path element of said plurality of data path elements.

15. The test of claim 13, wherein the means for coupling said plurality of test words to said plurality of data path elements is a read operation of the digital word.

16. The test of claim 13, wherein the means for testing charge build up is a read of a fourth bit, which is an opposite logical value to a preceding three bits of the test word.

17. The test of claim 13, wherein the means for testing signal coupling from adjacent data path elements simultaneously propagates test words that are logical complements on said adjacent data path elements.

* * * * *